United States Patent

Beck et al.

Patent Number: 5,937,321
Date of Patent: Aug. 10, 1999

[54] METHOD FOR MANUFACTURING CERAMIC MULTILAYER CIRCUIT

[75] Inventors: Walter Beck, Uttenweiler; Walter Roethlingshoefer, Reutlingen; Detlef Nitsche, Altdorf, all of Germany

[73] Assignee: Robert Bosch GmbH, Stuttgart, Germany

[21] Appl. No.: 08/956,666

[22] Filed: Oct. 23, 1997

[30] Foreign Application Priority Data

Nov. 9, 1996 [DD] German Dem. Rep. ...... 19646369634

[51] Int. Cl.$^6$ ............................................. H01L 21/4763
[52] U.S. Cl. .......................... 438/622; 438/618; 438/623
[58] Field of Search .................................. 438/622, 623, 438/618

[56] References Cited

U.S. PATENT DOCUMENTS 4,464,420  8/1984  Taguchi et al. .
4,821,142  4/1989  Ushifusa et al. .
5,454,927  10/1995  Credle et al. .

OTHER PUBLICATIONS

Bernhard H. Mussler et al, "LTCC—die zwingende Alternative" (LTCC—the compelling alternative), Productronic, No. 8, Nov. 1995, pp. 40–46.

Primary Examiner—Kevin M. Picardat
Assistant Examiner—D. Mark Collins
Attorney, Agent, or Firm—Kenyon & Kenyon

[57] ABSTRACT

A ceramic multilayer circuit and a method for manufacturing a ceramic multilayer circuit which has economical, corrosion-resistant external contacts or external conductor paths that are immune to the Kirkendall effect and can be utilized for different mounting processes. The circuit structure and the method involve the use of a pure silver paste to implement external conductor paths or external contacts. Corrosion resistance is ensured by a thin metallic protective layer.

7 Claims, 1 Drawing Sheet

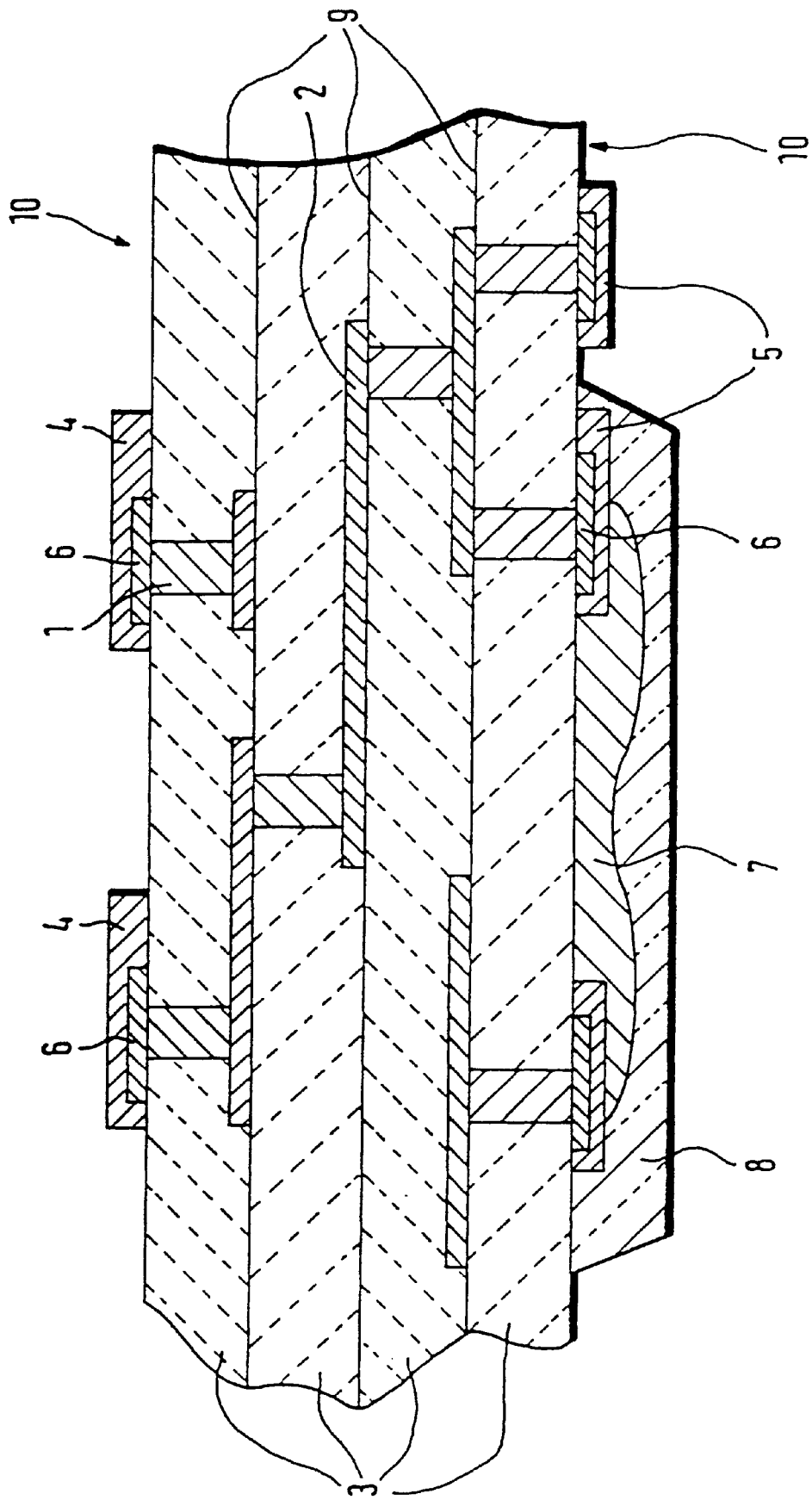

METHOD FOR MANUFACTURING CERAMIC MULTILAYER CIRCUIT

BACKGROUND INFORMATION

Ceramic multilayer circuits and methods for manufacturing them are described in the periodical "Productronic" No. 8, November 1995, pages 40 to 46 in the article "LTCC - die zwingende Alternative" (LTCC - the compelling alternative) by Bernhard H. Mussler et al., in which either pure silver is used for external metallizations or silver/palladium and/or gold are used in combination with intermediate conductor paths for external metallizations. When pure silver is used, corrosion occurs when storage conditions are undefined. When silver/palladium and/or gold are used in combination with intermediate conductor paths, diffusion processes (Kirkendall effect) occur at the transition from silver-filled feedthrough contact holes to silver/palladium or gold, and can lead to material impoverishment.

SUMMARY OF THE INVENTION

The method and circuit according to the present invention have the advantage of constituting a simple, economical, and time-saving method, the ceramic multilayer circuit being corrosion-resistant and equipped with low-resistance external contacts and external conductor paths.

The use of silver for external conductor paths results in low-resistance transitions, which are immune to the Kirkendall effect, to silver-filled feedthrough contacts of the ceramic multilayer circuit. A metallic protective layer over the external conductor paths or external contact made of silver imparts corrosion resistance to the latter.

A further advantage may be seen in the fact that because a metallic protective layer is provided, it is possible to use pure silver pastes as open mounting conductor paths, since because of the metallic protective layer, sulfur, chlorine, atmospheric moisture, etc. cannot harm the external conductor paths or external contacts.

In addition, the combination of different conductor path grades, such as gold, gold/silver, gold/silver/palladium, silver/palladium, silver/platinum, etc. is avoided, since, for example, intermediate conductor paths are no longer necessary. Time-consuming process steps, such as for example printing and firing a paste that is intended to serve as an intermediate conductor path after the manufacturing operation, are therefore also eliminated from the manufacturing method. Material costs, which are in some cases considerable, are also saved.

Furthermore, the provision of a nickel layer and of a gold layer arranged thereon, in particular using an electroless or galvanic method, constitutes a simple and cost-saving procedure for manufacturing a metallic protective layer.

In this context, the layer thickness of the nickel layer or the gold layer can be respectively optimized, for example, by configuring the gold layer to be somewhat thinner than the nickel layer so that as little gold as possible is required.

BRIEF DESCRIPTION OF THE DRAWING

The FIG. 1 depicts a ceramic multilayer circuit.

DETAILED DESCRIPTION

A construction of a ceramic multilayer circuit using the LTCC (low-temperature cofiring ceramics) technique is depicted in the FIGURE. Ceramic films are arranged into a film stack 3. Feedthrough contact holes 1 filled with conductive material create an electrical connection between conductor paths 2 on the various ceramic films. Because of the low specific resistance, silver pastes are preferably used to implement the interior conductor paths 2 and the filling of feedthrough contact holes 1. Arranged at the two exteriors 10 of the ceramic multilayer circuit are external contacts 5 which, for example, create the electrical contact to a resistor 7. In this context resistor 7 can, for example, be hermetically sealed off by a cover glass 8. External conductor paths 4 can also be provided. Materials such as gold, silver/gold, silver/palladium, silver/platinum, or silver/palladium/platinum are used for the external conductor paths, since pure silver is not corrosion-resistant at the surface. Only on interior sides 9 of the ceramic films of film stack 3 is the lack of corrosion resistance of pure silver unproblematic. In order additionally to minimize the resistance between external conductor paths 4 and the feedthrough contact holes 1, filled with silver, to which contact is to be made, intermediate conductor paths 6 which make possible a gradation of the silver content are provided. This also results in a reduction of the Kirkendall effect, i.e. suppresses undesired silver diffusion.

The method for manufacturing a ceramic multilayer circuit is as follows: Feedthrough contact holes 1 are punched into unfired ("green") ceramic films. The feedthrough contact holes are filled with a conductor path paste, in particular a silver paste, and in a further step conductor paths 2 made of electrically conductive material, in particular pure silver, are printed onto the films. The ceramic films are then stacked into a stack and, in a pressing operation, are joined to one another at slightly elevated temperature. This is followed by a sintering process. During or after the sintering process, external conductor paths and external contacts are printed on and fired. For resistors there are also special resistor pastes which are applied and subsequently fired. The more materials applied onto the exteriors 10 of the ceramic multilayer circuit, the more complex, cost-intensive, and time-consuming is the manufacturing process.

In ceramic multilayer circuits using the LTCC technique, a variety of conductor paths are necessary for mounting processes for different components. For example, gold-wire bonding of components onto the exteriors of the ceramic multilayer circuit requires a gold conductor path, and adhesive mounting of components and aluminum thick-wire bonding require a silver/palladium conductor path on the exteriors of the ceramic multilayer circuit. Similarly, the attachment of resistors and contacting surfaces requires silver/palladium conductor paths on the exteriors. The provision, according to the present invention, of external conductor paths or external contacts made of pure silver with, for example, a galvanic reinforcement by means of a thin nickel and thin gold layer makes it possible, with one type of external conductor path or external contact, to meet all requirements in terms of the techniques used to mount components on the exteriors of ceramic multilayer circuits. Preferably, in this context, after application of the silver paste, first an approximately 5 μm thick nickel layer and then an approximately 0.2 μm thick gold layer are applied in a subsequent process in galvanic or electroless fashion. A conductor path structure of this kind on the exteriors can be used for all common mounting processes, for example for aluminum or gold wire bonding, soldering, flip-chip mounting, adhesive bonding, or the attachment of other contacts.

What is claimed is:
1. A method for manufacturing a low-temperature ceramic multilayer circuit, comprising the steps of:
punching feedthrough contact holes in unfired ceramic films;

filling the feedthrough contact holes with a silver conductor path paste;

printing silver conductor paths onto the films;

stacking the films into a film stack;

joining, in a pressing operation, the stacked films to one another;

sintering the film stack;

applying, at least one of during the sintering operation and after the sintering operation, at least one of silver external conductor paths and silver external contacts onto exteriors of the film stack; and applying a metallic protective layer onto the at least one of the silver external conductor paths and the silver external contacts to produce the low-temperature ceramic multilayer circuit.

2. The method according to claim 1, wherein the metallic protective layer includes at least one of nickel and gold.

3. The method according to claim 1, further comprising the step of providing the at least one of the silver external conductor paths and the silver external contacts with a nickel layer and with a gold layer.

4. The method according to claim 1, wherein the metallic protective layer is applied using at least one of a galvanic technique and an electroless technique.

5. The method according to claim 3, wherein the nickel layer has a thickness of approximately 5 micrometers.

6. The method according to claim 3, wherein the gold layer has a thickness of approximately 0.2 micrometers.

7. The method according to claim 1, wherein the at least one of the silver external conductor paths and the silver external contacts is composed of a pure silver material.

* * * * *